United States Patent
Scheppach (12)

(10) Patent No.: US 6,484,112 B1
(45) Date of Patent: Nov. 19, 2002

(54) METHOD FOR ESTIMATING THE FREQUENCY OF A TIME SIGNAL

(75) Inventor: Frank Scheppach, Neu-Ulm (DE)

(73) Assignee: EADS Deutschland GmbH (DE)

( * ) Notice: Subject to any disclaimer, the term of this patent is extended or adjusted under 35 U.S.C. 154(b) by 0 days.

(21) Appl. No.: 09/600,649

(22) PCT Filed: Jan. 20, 1999

(86) PCT No.: PCT/DE99/00120

§ 371 (c)(1),
(2), (4) Date: Jul. 20, 2000

(87) PCT Pub. No.: WO99/38018

PCT Pub. Date: Jul. 29, 1999

(30) Foreign Application Priority Data

Jan. 22, 1998 (DE) ............................... 198 02 193

(51) Int. Cl.⁷ .............................................. G01R 29/02
(52) U.S. Cl. ...................................... 702/77; 324/76.77
(58) Field of Search ............................. 702/77, 66, 75, 702/179, 182, 189; 324/76.12, 76.19, 76.21, 76.22, 76.41, 76.52, 76.77

(56) References Cited

U.S. PATENT DOCUMENTS

| | | | |
|---|---|---|---|
| 4,630,228 A | 12/1986 | Tarczy-Hornoch et al. | |
| 5,291,081 A | 3/1994 | Takeuchi et al. | |
| 5,519,402 A | 5/1996 | Kitayoshi | |

FOREIGN PATENT DOCUMENTS

| | | | |
|---|---|---|---|
| DE | 40 16947 A1 | 12/1990 | |
| DE | 44 31 886 A1 | 5/1995 | |
| EP | 0 803 733 A1 | 10/1997 | |

OTHER PUBLICATIONS

Goto, Y: "Highly Accurate Frequence Interpolation of Apodized FFT Magnitude–Mode Spectra", Applied Spectroscopy, Bd. 52, Nr. 1, Jan. 1, 1998.

Hannaford, Blake; Short Time Fourier Analysis of the Electromyogram: Fast Movements of Constant Contraction; IEEE Transactions on Biomedical Engineering, vol. BME–33, No. 12, Dec. 1986.

Williams, Jack R., et al.; Spectrum analyzer overlap requirements and detectability using discrete Fourier transform and composite digital filters; J. Acoust. Soc. Am. 64(3), Sep. 1978.

Dillard, G.M., et al.; Mean–level detection in the frequency domain; IEE Proc.–Radar, Sonar Navig., vol. 143, No. 5, Oct. 1996.

Fliege, Norbert J.; Closed form Design of Prototype Filters for Linear Phase DFT Polyphase Filter Banks; IEEE International Symposium on Circuits and Systems, May 1993.

Advances in Cryptology–13 CRYPTO '94; 14th Annual International Cryptology Conference, Proceedings; Editor: Desmedt, Y.G.; Berlin, Germany: Springer–Verlag, Aug. 1994.

*Primary Examiner*—Marc S. Hoff
*Assistant Examiner*—Edward Raymond
(74) *Attorney, Agent, or Firm*—Pendorf & Cutliff

(57) ABSTRACT

A method for estimating the frequency of a time signal by means of a discrete Fourier transformation and interpolation between support points of the DFT spectrum. According to said method, the hamming window is used in a known manner for filter and the interpolation is carried out according to the mathematically calculated solution. The method makes use of the pact that a function of the third degree which can serve as correction distance has a clear solution within the definition range of the amount ration between a secondary maximum and a primary maximum of the DFT spectrum. The correction distance is calculated according to this solution on the basis of the ratio of the secondary maximum and the primary maximum.

4 Claims, No Drawings

METHOD FOR ESTIMATING THE FREQUENCY OF A TIME SIGNAL

BACKGROUND OF THE INVENTION

1. Field of the Invention

The invention relates to a method for estimating the frequency of a time signal through the use of a Discrete Fourier Transform (DFT) and interpolation between sample points of the DFT spectrum.

2. Description of the Related Art

Examples of methods for estimating frequency utilizing a Fourier Transform are used, for example, in FM CW (Frequency Modulated, Continuous Wave) Radar systems. The use of FM CW principals for level measurement is described by Dr. J. Olto in "Mickrowellensensor zur Füllstandsmessung" (Microwave sensor for level measurement), Sensoren-Technologie und Anwendungen, VDI Berichter 939, 1992, pages 95–100, and in "Mikrowellen messen Füllstände" in Design & Electronik-Sensortechnik, May 1997, issue 10, pages 40–44. The same author describes digital methods for frequency determination of single and multi-frequency signals utilizing various methods of interpolation of the Fourier spectrums. By using interpolation a vastly more accurate distance measurement made through frequency estimations can result. Shown are for example interpolation using averaging or by parabolic approximation.

A process for estimating the frequency of a time signal using Fourier Transform and the interpolation between support points of the discrete Fourier transformation using a Hamming windowing is described in "Highly Accurate Frequency Interpolation of Apodized FFT Magnitude-Mode Spectra," by Goto in Applied Spectroscopy, Vol. 52, Nr.1, 1998, page 134 et seq.

Evaluation methods for precision distance measurement with FM CW systems and their use in the microwave field are described by Stolle, Heuerman and Schiek in tm-Technishes Messen 62 (2/95), pages 66–73.

Methods for accurate frequency estimation of a Fourier transformed time signal through interpolation are described by Jain, Collins and Davis in "High-Accuracy Analog Measurements via Interpolated FFT" IEEE Vol. IM-28, No. 2, June 1979, pages 1213–122 and by Grandke in "Interpolation Algorithms for Discrete Fourier Transforms of Weighted Signals," IEEE Vol. IM-32, No. 2, June 1983, pages 350–355.

Further methods of frequency estimation can be found in "Calculation of Narrow-Band Spectra by Direct Decimation" by Liu and Mintzer in IEEE Transactions, Vol. ASSP-26, No. 6, December 1978, pages 529 through 534; and in "Some Aspects of the Zoom Transform," by Yip in IEEE Transactions on Computers, Vol. C-25 No. 3, March 1976, pages 297 through 296.

The precise frequency measurement is carried out by the known Fourier-spectrum synthesis methods primarily accomplished through interpolation formula for the signal filtering through rectangular- or Hanning-windowing functions that are describable as simple equations. The Hanning interpolation formula can also be described as a signal with Hamming windowing under the assumption of an infinite expansion of a complex time signal and accepting the systematic errors of that formula.

The invention is based upon providing a method of frequency estimation that is advantageous with regards to frequency accuracy and processing expense.

SUMMARY OF THE INVENTION

The method of the invention takes advantage of the well known advantageous spectral characteristics of the Hamming window function and in particular allows an increase of the precision of a frequency estimate using a single detection with less complexity by not requiring insertion of the numerical method for the determination of the interpolation size. In particular, the invention may be represented as a closed end solution of a systematically correct equation for infinitely long real mono-tone signals as an approximation of real signals of finite length.

With the method of the invention, there are no further required approximations for the determination of the interpolation size, for instance through iterative, numerical evaluation of an interpolation rule. The off-line construction of interpolation weights, whose tabular arrangement is certainly possible and advantageous, the closed form solution algorithm will preferably be carried out as an online calculation with a default. By default, a tabular evaluation is more advantageously the maximum deviation of the stored values dependent upon the solution determined from the ratios a from adjacent maximum to high-maximum and is preferably smaller than the m-th part of the maximum values of the interpolation size with m being the number of the solution increment of the defined range of $\alpha$.

DETAILED DESCRIPTION OF THE INVENTION

The invention is further illustrated below by derivation and presentation of a preferred algorithm.

For the sake of simplicity, a single frequency timing signal of frequency $f_0$ will be examined as a discrete time signal, which is inside of a limited time window of length $N \cdot T_A$ in the form of N discrete sample values s(k) with a distance of the sampling period $T_A$.

$$s(k) = V \cdot \sin(2\pi f_0 \cdot k \cdot T_A + \Phi) \quad 0 \leq k \leq N-1$$

with V defined to be the amplitude and $_\Phi$ defined to by the initial phase (k=0). The generalized cosine window $$w(i) = a - (1-a) \cdot \cos\left(2\pi \cdot \frac{i}{N}\right)$$

of the Hamming window function with a=0.54 has the Fourier transform function:

$$W(k) = N \cdot \left(-\frac{1-a}{2} \cdot \delta(k+1) - \frac{1-a}{2} \cdot \delta(k-1)\right)$$

with k as the discrete sample (bin) of the spectrum and $\delta$ being the dirac-delta function.

Through the convolution of the Fourier-transform of the Hamming window function W(k) with the timing signal s(k) and application of the discrete Fourier Transform, one obtains the DFT-spectrum $S_w(i)$ which is the Hamming window weighted time signal with i as the number of the discrete sample (or bin) of the spectrum.

As a rule, the frequency $f_0$ of the timing signal does not exactly match the frequency of the discrete frequency bin of the DFT spectrum $f_i = i/(N^*T_A)$. For the frequency $f_0$ which is not known a priori, many lines will result in the DFT spectrum, with a highest maximum at i=l as the highest value line and one of the adjacent (largest) neighboring maximum appears at i=l+1 or i=l-1. The sought after frequency $f_0$ lies in the frequency interval between sample (or bin) i=l−1 and sample (or bin) i=l+1 at a correction distance d from the main line i=l according to $f_0 = \lambda * (N*T_A)$ with $\lambda = l+d$ and $-1 \leq d \leq +1$, where d will also be denoted as a sub-bin.

Preferably the more exact frequency estimate based upon the correction distance calculation will be based upon the size of the highest maximum Sw(i) and the size of the adjacent maximum Sw(i±1). Preferably, the ratio of these two sizes $$\alpha = \frac{|S_w(l \pm 1)|}{|S_w(l)|}$$

will be formed, which is in the range of $0 \leq \alpha \leq 1$. For the application of these ratios as an aid, the relation is more advantageously derived for the solution of the correction distance d, $$\alpha = \frac{|(-2 + 4d - 2d^2 + a \cdot (-2 - 8d + 4d^2)) \cdot (d+1)|}{|-2d + a \cdot (4d^2 - 2) \cdot (d-2)|}$$

which can be simplified by merely making small angle approximations. According to the definition of the Hamming window, a=0.54 and the prominent relation for $\alpha$ transforms itself into the third degree equation $$d^3(0.16\alpha + 0.16) + d^2(-0.32\alpha - 0.16) + d(-1.08\alpha - 1.24) + 2.16\alpha - 0.92 = 0$$

This equation advantageously represents a closed end solution for the defined region of $\alpha$ ($0 \leq \alpha \leq 1$), according to which the calculation of the correction distance will be preferably realized. The introduction of an aid to simplify notation results in the closed end solution for $$d = \frac{x}{3} - \frac{a_2}{2}$$

where $$x = -2 \cdot \sqrt{\left|\frac{p}{3}\right| \cdot \cos\left(\frac{\varphi}{3} + \frac{\pi}{3}\right)}$$

$$\varphi = \arccos\left(-\frac{q}{2} \cdot \sqrt{\left(\frac{|p|^3}{3}\right)}\right)$$

$$p = a_1 - \frac{1}{3}a_2^2$$

$$q = \frac{2}{27}a_2^3 - \frac{1}{3}a_1 a_2 + a_0$$

$$a_0 = \frac{(2.16\alpha - 0.92)}{c}$$

$$a_1 = \frac{(-1.08\alpha - 1.24)}{c}$$

$$a_2 = \frac{(-0.32\alpha - 0.16)}{c}$$

$$c = 0.16\alpha + 0.16.$$

The prominent equation for d forms an analytical and definite solution for the problem of the interpolation between sample points (or bins) of the DFT spectrum with a Hamming Window function filtered time signal on the basis of the ratios of the highest maximum and its adjacent maximum.

The sequence of Sw(l) for the highest maximum and Sw(l+1) for the adjacent maximum forms the basis for the derivation of the solution for d. When the location of the adjacent maximum is i=l−1, the accurate estimation of the frequency is $\lambda = l+d$, merely the sign of the ascertained value for the correction distance d is inverted.

The invention is not limited by the described examples, and it is within the skill of those in the art to apply the invention in different ways.

What is claimed is:

1. Method for estimation of the frequency of a timing signal by means of a discrete Fourier Transformation of the timing signal and interpolation between samples of the DFT spectrum, wherein the timing signal is filtered with a Hamming Window function, thereby characterized, that the interpolation is resolved according to a mathematically closed end solution, that the interpolation is resolved on the basis of the value ratio $\alpha$ of the highest maximum Sw(l) and its adjacent maximum Sw(l+1) in the DFT Spectrum, $$\alpha = \frac{|S_w(l \pm 1)|}{|S_w(l)|}$$

wherein the correction distance d(−1<d<+1) about the spectral lines of the highest maximum is determined by the relationship $$\alpha = \frac{|(-2 + 4d - 2d^2 + a \cdot (-2 - 8d + 4d^2)) \cdot (d+1)|}{|-2d + a \cdot (4d^2 - 2) \cdot (d-2)|}$$

and wherein the correction distance d is computed according to the solution for d, which is definite over the region $0 \leq \alpha \leq 1$, of the relationship between $\alpha$ and d.

2. Method according to claim 1, wherein the correction distance is calculated according to $$d = \frac{x}{3} - \frac{a_2}{2}$$

wherein $$x = -2 \cdot \sqrt{\left|\frac{p}{3}\right| \cdot \cos\left(\frac{\varphi}{3} + \frac{\pi}{3}\right)}$$

$$p = a_1 - \frac{1}{3}a_2^2,$$

$$q = \frac{2}{27}a_2^3 - \frac{1}{3}a_1 a_2 + a_0,$$

$$a_0 = \frac{(2.16\alpha - 0.92)}{c}$$

$$a_1 = \frac{(-1.08\alpha - 1.24)}{c}$$

$$a_2 = \frac{(-0.32\alpha - 0.16)}{c}$$

$$c = 0.16\alpha + 0.16.$$

3. Method according to claim 1, wherein the correction distance d is taken from an allocation table.

4. Method according to claim 3, wherein the table is addressed by the value of the value-ratio $\alpha$ or by a value derived therefrom.

* * * * *